United States Patent
Peng et al.

(10) Patent No.: US 10,955,614 B1
(45) Date of Patent: Mar. 23, 2021

(54) OPTICAL FIBER COUPLER STRUCTURE HAVING MANUFACTURING VARIATION-SENSITIVE TRANSMISSION BLOCKING REGION

(71) Applicant: GLOBALFOUNDRIES U.S. Inc., Santa Clara, CA (US)

(72) Inventors: Bo Peng, Sharon, MA (US); Ajey Poovannummoottil Jacob, Watervliet, NY (US); Yusheng Bian, Ballston Lake, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 16/742,165

(22) Filed: Jan. 14, 2020

(51) Int. Cl.
| | |
|---|---|
| *G02B 6/12* | (2006.01) |
| *G02B 6/30* | (2006.01) |
| *G02B 6/122* | (2006.01) |
| *G02B 6/124* | (2006.01) |
| *G02B 6/14* | (2006.01) |
| *H01L 21/66* | (2006.01) |
| *G03F 7/20* | (2006.01) |
| *G02B 6/36* | (2006.01) |

(Continued)

(52) U.S. Cl.
CPC ......... *G02B 6/1225* (2013.01); *G02B 6/124* (2013.01); *G02B 6/1228* (2013.01); *G02B 6/14* (2013.01); *G02B 6/305* (2013.01); *G03F 7/70625* (2013.01); *H01L 22/30* (2013.01); *G02B 6/0026* (2013.01); *G02B 6/34* (2013.01); *G02B 6/3636* (2013.01); *G02B 2006/1213* (2013.01); *G03F 7/70616* (2013.01); *H01L 22/12* (2013.01)

(58) Field of Classification Search
None
See application file for complete search history.

(56) References Cited

U.S. PATENT DOCUMENTS

| | | | |
|---|---|---|---|
| 6,253,015 B1 * | 6/2001 | Ukrainczyk | B82Y 20/00 385/129 |
| 6,293,688 B1 | 9/2001 | Deacon | |

(Continued)

FOREIGN PATENT DOCUMENTS

JP      2019-60988 A  *  4/2019

OTHER PUBLICATIONS

Cheben et al., "Refractive Index Engineering with Subwavelength Gratings for Efficient Microphotonic Couplers and Planar Waveguide Multiplexers," Optics Letters vol. 35, 2010, Issue 15, pp. 2526-2528.

(Continued)

*Primary Examiner* — Michael Stahl
(74) *Attorney, Agent, or Firm* — Gibb & Riley, LLC

(57) ABSTRACT

Optical coupler structures have an insulator layer on a substrate, a waveguide structure in the insulator layer, and a cladding layer on the waveguide structure and the insulator layer. Optical grating couplers are on the cladding layer and the waveguide structure is connected between the optical grating couplers. The waveguide structure is discontinuous between the optical grating couplers. The insulator layer includes an array at a transmission blocking region between discontinuous sections of the waveguide structure. This array can be a void opening array of openings or can be a blocking element array of disconnected elements in the insulator layer.

20 Claims, 11 Drawing Sheets

(51) Int. Cl.
*F21V 8/00* (2006.01)
*G02B 6/34* (2006.01)

(56) References Cited

U.S. PATENT DOCUMENTS

| | | | | |
|---|---|---|---|---|
| 7,072,547 | B2* | 7/2006 | Assefa | B82Y 20/00 385/15 |
| 7,082,235 | B2* | 7/2006 | Gunn, III | B82Y 20/00 385/14 |
| 7,158,710 | B1* | 1/2007 | Zhou | B82Y 20/00 385/129 |
| 7,242,837 | B2* | 7/2007 | Talneau | B82Y 20/00 385/129 |
| 9,086,387 | B2 | 7/2015 | Assefa et al. | |
| 9,274,276 | B2 | 3/2016 | Jahani et al. | |
| 9,459,177 | B1* | 10/2016 | Dong | H01L 22/30 |
| 9,529,062 | B2 | 12/2016 | Iyer et al. | |
| 10,126,500 | B2 | 11/2018 | Qi et al. | |
| 10,197,731 | B2 | 5/2019 | Teng et al. | |
| 10,365,435 | B1* | 7/2019 | Karimelahi | G02B 6/2726 |
| 2002/0191933 | A1* | 12/2002 | Tokushima | G02B 6/1225 385/129 |
| 2005/0194990 | A1* | 9/2005 | Gothoskar | G02B 6/30 324/754.23 |
| 2006/0193552 | A1* | 8/2006 | Sugita | B82Y 20/00 385/14 |
| 2010/0226609 | A1* | 9/2010 | Tokushima | G02B 6/305 385/50 |
| 2012/0301075 | A1* | 11/2012 | Wang | B82Y 20/00 385/28 |
| 2014/0061677 | A1* | 3/2014 | Jakoby | G01N 21/7703 257/80 |
| 2014/0140655 | A1* | 5/2014 | Chakravarty | B82Y 20/00 385/12 |
| 2014/0268120 | A1* | 9/2014 | Assefa | G01N 21/8806 356/237.5 |
| 2015/0180133 | A1 | 6/2015 | Hunt et al. | |
| 2016/0025622 | A1* | 1/2016 | Lavchiev | G01N 21/27 356/440 |
| 2017/0017034 | A1 | 1/2017 | Painchaud et al. | |
| 2017/0146738 | A1* | 5/2017 | Xu | G02F 1/0147 |
| 2018/0010906 | A1* | 1/2018 | Tokushima | G02B 6/34 |
| 2018/0313718 | A1* | 11/2018 | Traverso | G02B 6/305 |
| 2018/0335365 | A1* | 11/2018 | Kamei | G02B 6/1228 |
| 2019/0121126 | A1 | 4/2019 | Simmonds | |
| 2020/0027798 | A1* | 1/2020 | Lin | G02B 1/11 |
| 2020/0033533 | A1* | 1/2020 | Khanna | G02B 6/12004 |
| 2020/0081155 | A1* | 3/2020 | Jin | G02B 6/125 |

OTHER PUBLICATIONS

Cheben et al., "Subwavelength Waveguide Grating for Mode Conversion and Light Coupling in Integrated Optics," Optics Express, vol. 14, No. 11, 2006, pp. 4695-4702.

Teng et al., "Trident Shape SOI Metamaterial Fiber-to-Chip Edge Coupler," Optical Fiber Communications Conference and Exhibition (OFC), 2019, pp. 1-3.

Cheben et al., "Broadband Polarization Independent Nanophotonic Coupler for Silicon Waveguides with Ultra-High Efficiency," Optics Express, vol. 23, No. 17, 2015, pp. 22553-22563.

Papes et al., "Fiber-Chip Edge Coupler with Large Mode Size for Silicon Photonic Wire Waveguides," Optics Express, vol. 24, No. 5, 2016, pp. 5026-5038.

Sarwicz et al., "An O-Band Metamaterial Converter Interfacing Standard Optical Fibers to Silicon Nanophotonic Waveguides," Optical Fiber Communication Conference, OSA Technical Digest (online), Optical Society of America, 2015, Paper Th3F.3, pp. 1-3.

Shang et al., "Silicon Nitride Tri-Layer Vertical Y-Junction and 3D Couplers with Arbitrary Splitting Ratio for Photonic Integrated Circuits," Optics Express, vol. 25, No. 9, 2017, pp. 10474-10483.

Giewont et al., "300-mm Monolithic Silicon Photonics Foundry Technology," IEEE Journal of Selected Topics in Quantum Electronics, vol. 25, No. 5, 2019, pp. 1-12.

Milosevic et al., "Towards Autonomous Testing of Photonic Integrated Circuits," Proceedings of SPIE, vol. 10108, Silicon Photonics XII, 2017, pp. 1-8.

Grillanda et al., "Non-Invasive Monitoring and Control in Silicon Photonics Using CMOS Integrated Electronics," Optical Society of America, Research Article, vol. 1, No. 3, 2014, pp. 129-136.

Hu et al., "Fully Automated In-Line Optical Test System," IEEE, Advanced Materials & Photonics, 2018, pp. 399-402.

Chrostowski et al., "Impact of Fabrication Non-Uniformity on Chip-Scale Silicon Photonic Integrated Circuits," Optical Society of America, Th2A.37, 2014, pp. 1-3.

Overton et al., "Silicon Photonics: Erasable Gratings Facilitate Automated PIC Testing," 2017, https://www.laserfocusworld.com/test-measurement/test-measurement/article/16548204/silicon-photonics-erasable-gratings-facilitate-automated-pic-testing, pp. 1-2.

* cited by examiner

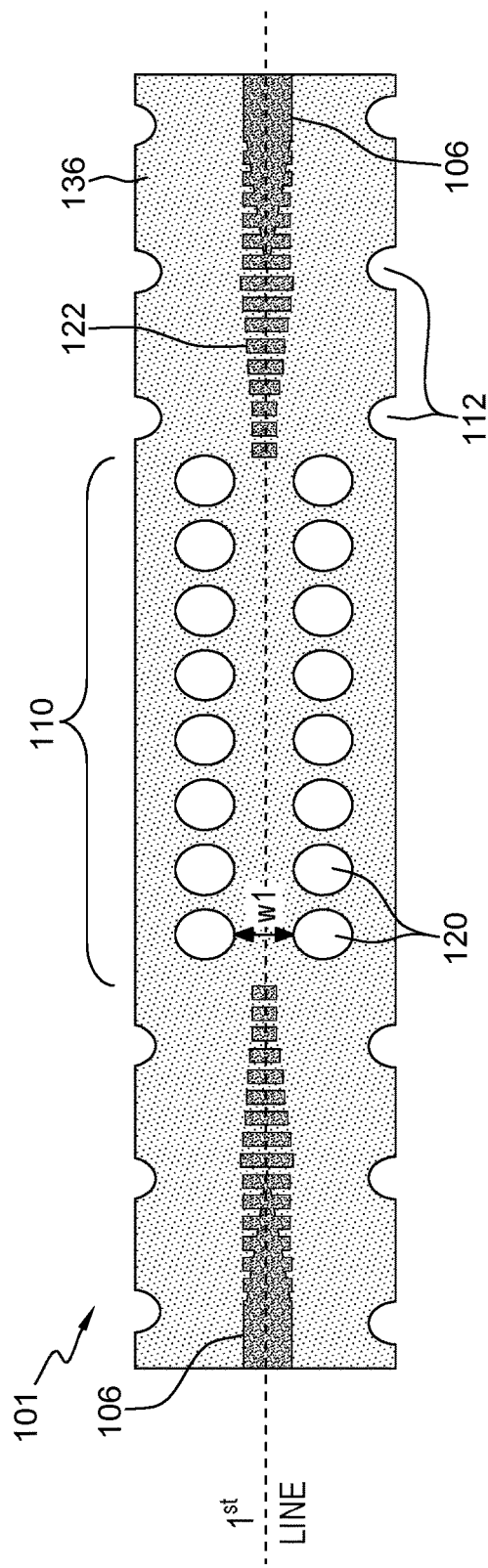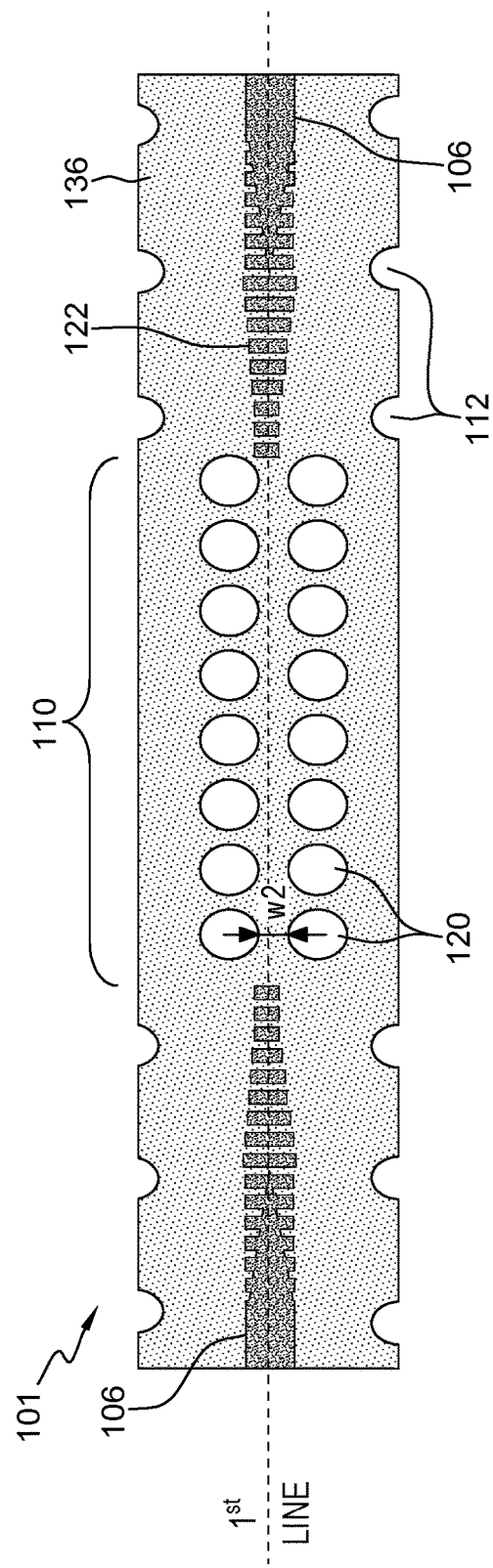

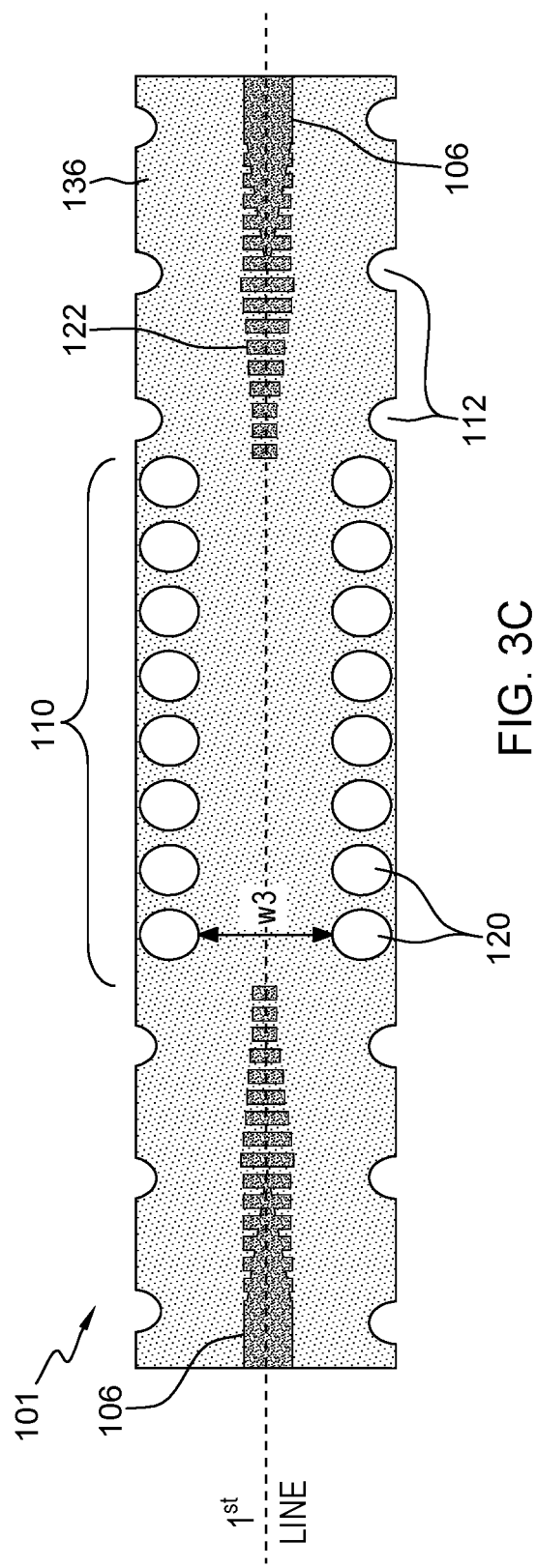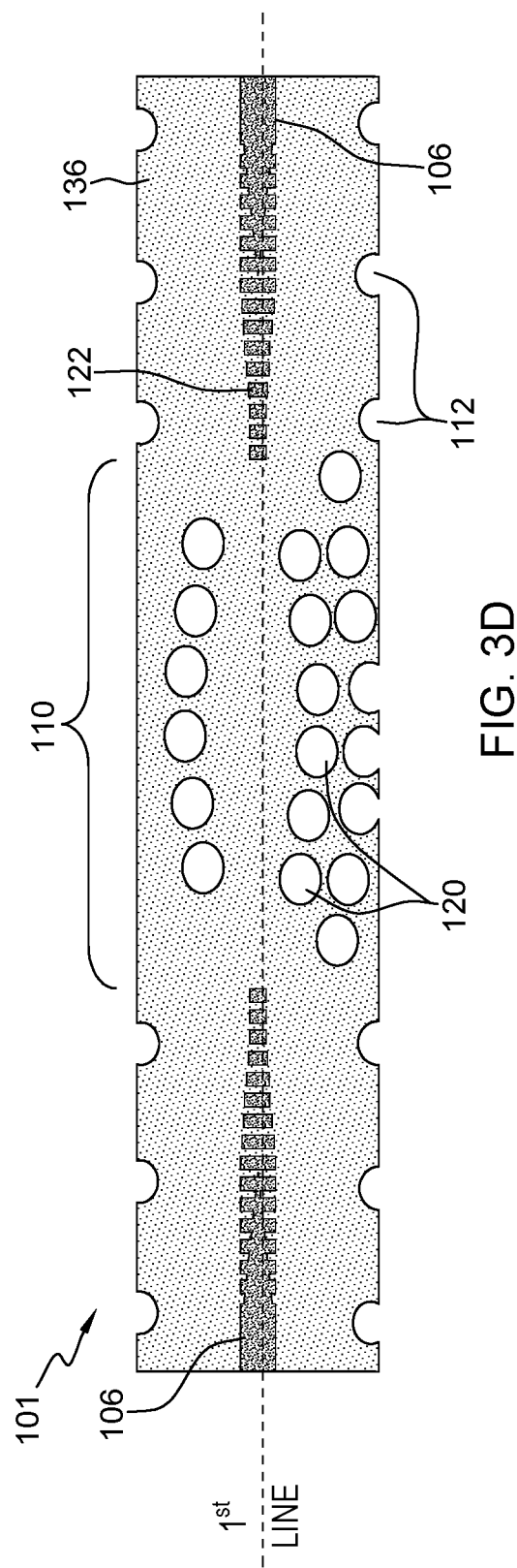

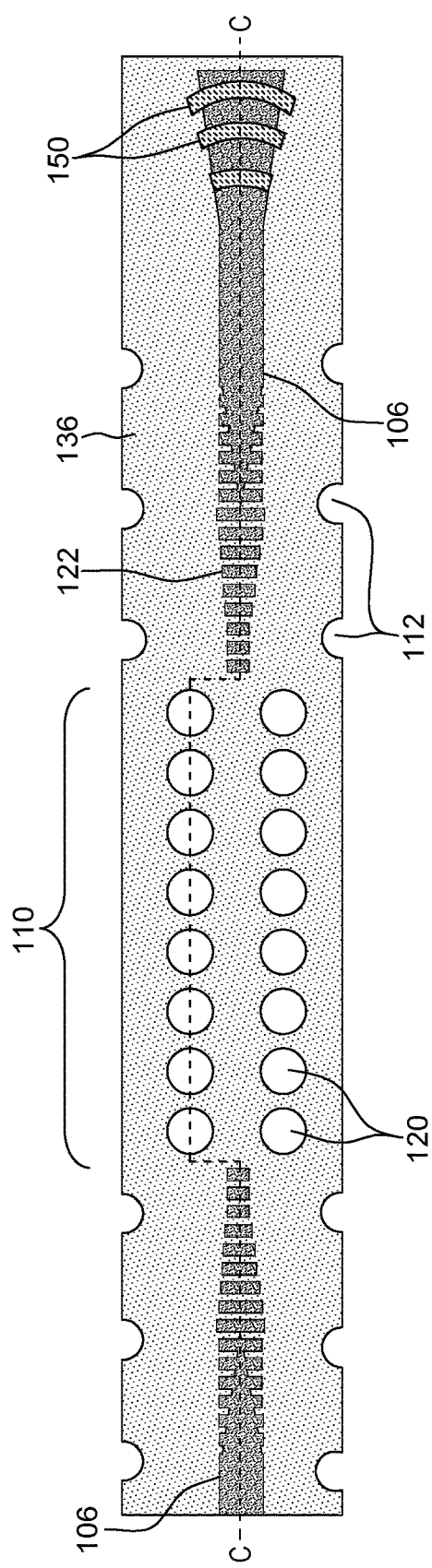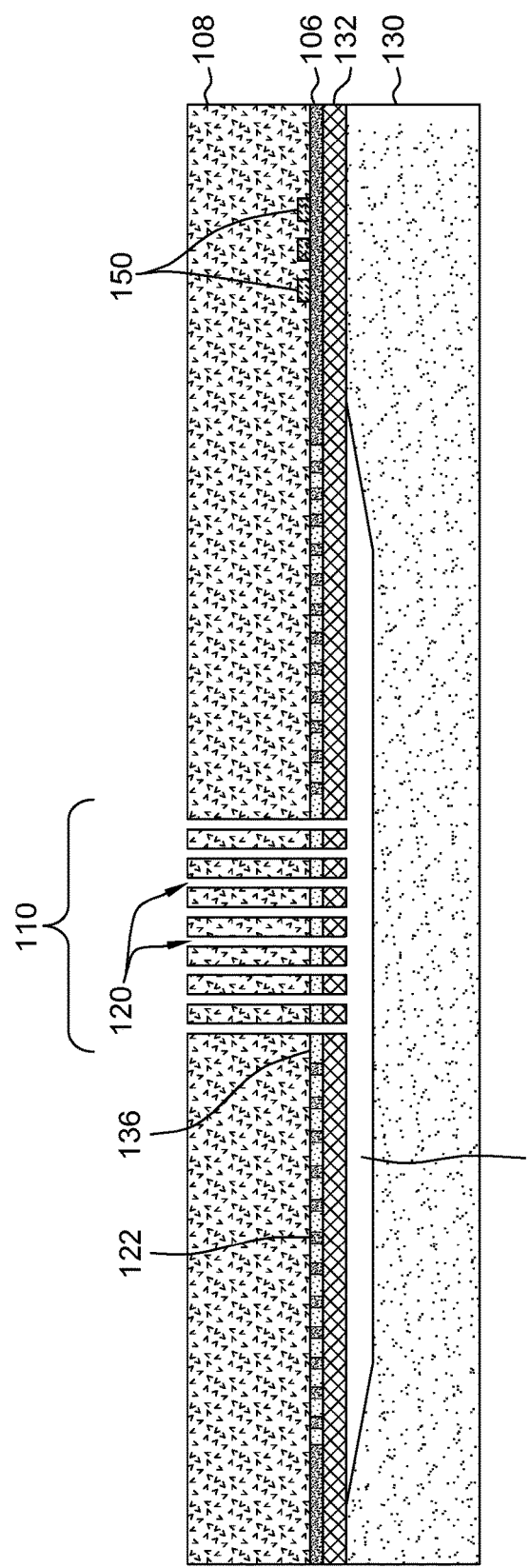
FIG. 5A
FIG. 5B

OPTICAL FIBER COUPLER STRUCTURE HAVING MANUFACTURING VARIATION-SENSITIVE TRANSMISSION BLOCKING REGION

BACKGROUND

Field of the Invention

The present disclosure relates to optical fiber coupler structures and more specifically to structures that are sensitive to manufacturing variations.

Description of Related Art

Many communication systems utilize light to transmit data in order to increase transmission speed and bandwidth. For purposes herein the term "light" includes all forms of electromagnetic radiation including that within the human-visible wavelengths and outside such wavelengths.

In order to perform light transmission, optical fibers are made of materials that have high internal reflectivity such as glass, plastic, etc. Such optical fibers are often connected to electronic circuitry that can discern the data within the light. Optical fiber couplers are commonly used to physically connect the circuitry with the optical fibers. For example, light waves within waveguides can have many modes including transverse electromagnetic (TEM) modes, transverse electric (TE) modes, transverse magnetic (TM) modes, etc. Some optical fibers can transmit light waves of many modes (multi-mode fibers) while other optical fibers can transmit only a single mode (single-mode fibers).

One issue that sometimes arises relates to the coupling loss and conversion loss associated with connections between the optical fibers and the coupler. Specifically, insertion loss at the optical edge coupler is sensitive to fabrication defects including critical dimension (CD) offset and irregular sizing/spacing caused by over-etching. This is especially true in silicon-based edge couplers that have a high refractive index contrast between the core and the cladding that use self-alignment mechanisms. Insertion loss includes coupling loss and conversion loss at the optical edge coupler, and both are very sensitive to critical dimension (CD) offset and irregular sizing/spacing caused by over-etching.

SUMMARY

Optical coupler structures herein include (among other elements) an insulator layer on a substrate, a waveguide structure in the insulator layer, and a cladding layer on the waveguide structure and the insulator layer. Optical grating couplers are on the cladding layer and the waveguide structure is connected between the optical grating couplers. The substrate has a lower layer connected to an upper layer, where the upper layer is between the lower layer and the insulator layer. The lower layer includes a groove aligned with and parallel to the waveguide structure.

The waveguide structure has discontinuous sections between the optical grating couplers. The insulator layer includes an array at a transmission blocking region that is between the discontinuous sections of the waveguide structure. In different embodiments, this array can be a void opening array of openings or can be a blocking element array of disconnected elements in the insulator layer.

In the void opening array structures, the openings of the void opening array extend fully from the top of the cladding layer through the cladding layer, the insulator layer, and the upper layer of the substrate to the groove in the lower layer of the substrate. The waveguide structure is linear along a first line, and the openings of the void opening array are aligned in the insulator layer parallel to and offset from the first line, along the transmission blocking region. The openings of the void opening array can be aligned linearly or curvilinearly.

In the blocking element array structures, the disconnected elements of the blocking element array can be one or more levels of conductive disconnected elements or insulating disconnected elements within the insulator layer. The disconnected elements of the blocking element array are aligned in the insulator layer parallel to and offset from the first line along the transmission blocking region.

The waveguide structure can have continuous or segmented tapered waveguide structure ends that border the transmission blocking region. These structures can also include a patterned conductor on at least one of the discontinuous sections of the waveguide structure.

These and other features are shown in the accompanying drawings, discussed below.

BRIEF DESCRIPTION OF THE DRAWINGS

The embodiments herein will be better understood from the following detailed description with reference to the drawings, which are not necessarily drawn to scale and in which:

FIGS. 3A-3D are top view schematic diagram illustrating a portion of the optical fiber coupler structure shown in FIG. 1A;

FIG. 5A is a top view schematic diagram illustrating a portion of the optical fiber coupler structure according to embodiments herein;

FIG. 5B is a cross-sectional view schematic diagram of the optical fiber coupler structure shown in FIG. 5A;

DETAILED DESCRIPTION

Figure 1A:
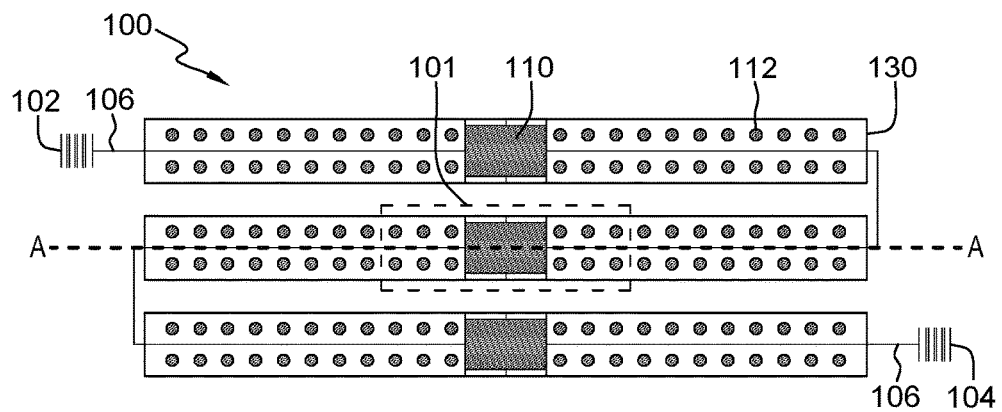
FIG. 1A is a top view schematic diagram illustrating an optical fiber coupler structure according to embodiments herein.

As mentioned above, sometimes there is coupling loss and conversion loss associated with connections between the optical fibers and the coupler and these losses are affected by manufacturing variations. In order to test or monitor such losses, optical coupler structures can be formed alongside optical couplers (concurrently on the same wafer, using the same processing, etc.). Because the optical coupler structures are formed simultaneously or concurrently with the optical couplers, the optical coupler structures will suffer from the same manufacturing variations that the optical couplers experience. Inputs can be provided to such optical coupler structures, and the outputs from these optical coupler structures provide an accurate indicator of the quality of the optical couplers that were concurrently formed on the same wafer.

Optical coupler structures that utilize a grating coupler can be supplied inputs before the wafer is divided into individual dies/chips, because the grating couplers are parallel to the wafer surface. This allows the optical fibers supplying the inputs to be connected to the grating couplers in an approximate perpendicular direction to the wafer surface. With other optical coupler structures that use edge coupling, the optical coupler structures are only utilized after the wafer has been divided into individual dies/chips. After dicing of the wafer, optical fibers that supply the inputs are connected to the cut edges of such "edge-connected" optical coupler test structures.

Edge-connected optical coupler test structures are conventionally preferred for measure coupling loss and conversion loss caused by critical dimension offset and irregular sizing/spacing resulting from over-etching because such losses are highly correlated to edge-connection alignment. Specifically, the edge connections to edge-connected optical coupler structures will accurately reveal edge-connection alignment issues that would not be measurable when using the approximate perpendicular-to-wafer surface connections of grating coupler-connected optical coupler structures. However, waiting until the wafer has been diced into individual chips adds extra processing steps and processing time that grating coupler optical coupler structures avoid.

In order to make the output from the grating coupler-connected optical coupler structures disclosed herein accurately represent what edge-connected optical couplers will produce, the grating coupler-connected optical coupler structures herein utilize a manufacturing sensitive transmission blocking region that includes an array crafted to reveal edge-connection alignment issues. Therefore, in order to take advantage of the reduced processing steps and reduced processing time afforded by grating coupler-connected optical coupler structures, yet improve the measurement of coupling loss and conversion loss associated with edge-connection alignment issues, the optical coupler structures herein utilize a waveguide structure that has discontinuous sections between the edge coupler spot-size converter connecting to the optical grating couplers, with an optical mode rectifier that uses an array at a transmission blocking region that is between the discontinuous sections of the waveguide structure. In different embodiments, this array can be a "void opening array" of openings or can be a "blocking element array" of disconnected elements in the insulator layer. The array and transmission blocking region act as an optical mode rectifier to alter the output of the optical coupler structure.

This optical mode rectifier included in the optical coupler structures herein improves the measurement accuracy of coupling loss and conversion loss associated with edge-connection alignment issues to that of edge-connected devices by quantitatively characterizing propagation loss. Specifically, physical manufacturing variations of this optical mode rectifier change known inputs in a predictable way at the outputs of optical coupler structures herein. Variations from what is known to be an acceptable optical mode rectifier output shows the amount of coupling loss and conversion loss caused by alignment issues such as critical dimension offset defects and irregular sizing/spacing resulting from over-etching (and the same losses will be evident in the optical couplers manufactured on the same wafer as the optical coupler structure).

As noted above, an optical mode rectifier included is provided in the optical coupler structures herein. This optical mode rectifier interfaces the initial mode and reshapes the mode profile by physically blocking or scattering part of the mode. Transmission are specifically truncated to a matched mode that aligns with the reshaped mode profile. Manufacturing variations (CD changes, over-etching) will change the initial mode profile (e.g., increasing or decreasing silicon core dimensions causes opposite directions of the mode profile change, either making it larger or smaller in mode size). Thus, this matching to the reshaped mode profile controlled by the rectifier impacts the total transmitted power. The actual change in the output of the optical coupler structure herein (from a known input) can be compared to a known standard (e.g., an insertion loss measure) to determine the loss in the propagation that has occurred in the optical couplers that were manufactured on the same wafer as the optical coupler structure to thereby reveal whether the structures on the wafer have suffered critical dimension offset defects and irregular sizing/spacing resulting from over-etching.

Referring now to the drawings, FIG. 1A illustrates an exemplary optical fiber coupler structure 100 herein that includes (among other elements) optical grating couplers 102, 104 on a substrate 130, a waveguide structure 106 connected between the optical grating couplers 102, 104, and periodic undercut holes 112 that are used during far back end of line (FBEOL) to provide V-groove undercut, etc., and similar final product processing. FIG. 1 also illustrates a transmission blocking region 110 that acts as an optical mode rectifier, as explained in greater detail below. Rectangular area 101 is not a physical feature but instead is included in the drawing for reference and rectangular area 101 is the area of the optical coupler structures 100 shown in greater detail in FIG. 2A.

Figure 1B:
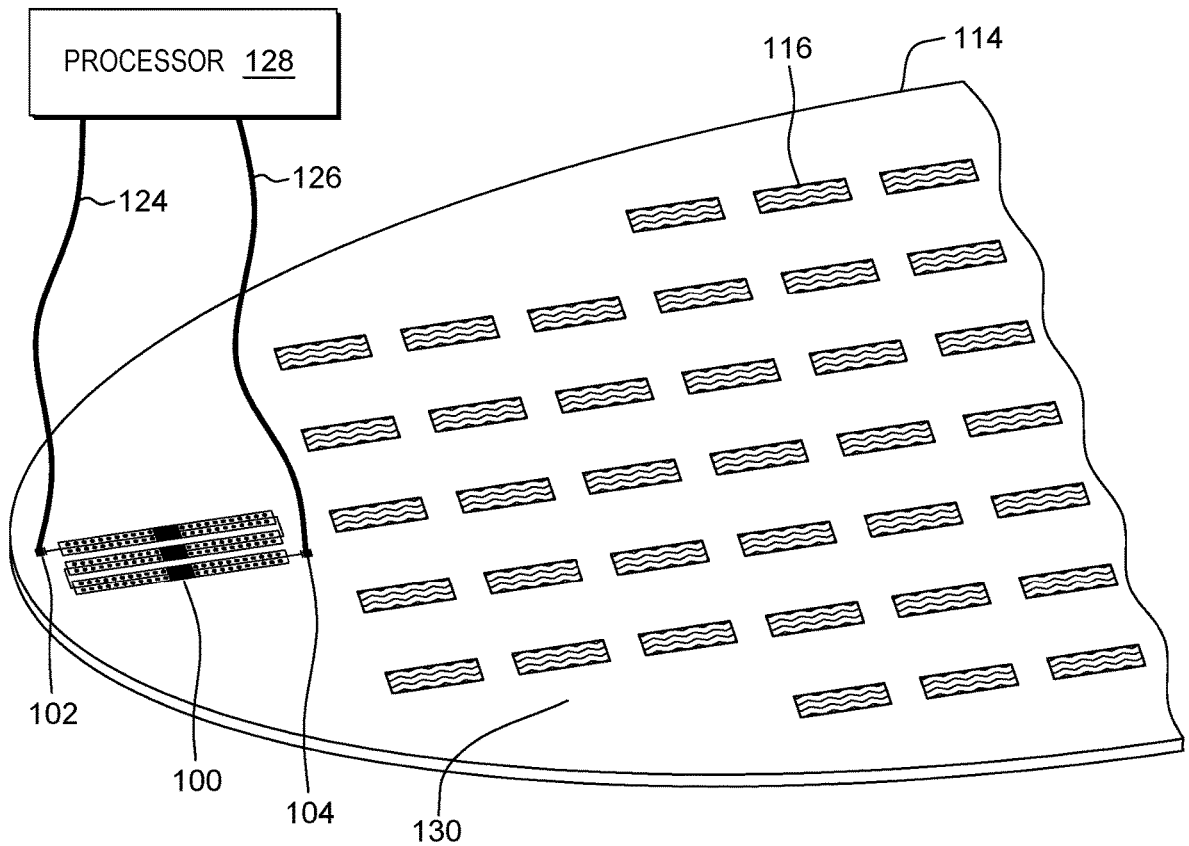
FIG. 1B is a perspective view schematic diagram illustrating an optical fiber coupler structure shown in FIG. 1A on a wafer according to embodiments herein.

Referring to FIG. 1B, a very oversimplified and excessively oversized (for ease of illustration only) perspective view implementation of the optical coupler structure 100 is shown as being located on wafer 114 (only a portion of which shown). While only one optical coupler structure 100 is illustrated in FIG. 1B, many optical coupler structures 100 could be formed on other areas of the wafer 114.

The wafer 114 includes a substrate 130 upon which the optical coupler structure 100 and chips 116 (some of which contain optical couplers) are simultaneously or concurrently formed. After the wafer 114 has been completed, it can be cut into individual pieces (chips 116, etc.). The optical couplers can be located at the edges of the chips 116 allowing optical fibers to be connected to the edges (cut regions) of the chips 116, which permits optical signals to be supplied to the chips 116. Features of the optical coupler structure 100 and the optical couplers within the chips 116 are formed using the same masks, same etching processes, same deposition processes, same implant processes, etc., at the same time (e.g. simultaneously, concurrently, etc.) for manufacturing efficiency. This concurrent manufacturing of the chips 116 containing optical couplers and optical coupler structures 100 causes the optical coupler structure 100 to suffer from the same manufacturing variances that the optical couplers within the chips 116 will experience. In other words, defects in the chips 116 containing optical couplers will also appear in the optical coupler structure 100.

FIG. 1B also illustrates optical fibers 124, 126 that are used to connect a testing processor 128 or other similar device to the optical grating couplers 102, 104. As shown in FIG. 1B, the optical fibers 124, 126 are connected to the wafer 114 before the wafer is cut into individual chips 116. Therefore, the optical fibers 124, 126 are positioned to have their length dimension perpendicular to the surface of the wafer 114 and are connected in a manner that allows light energy within the optical fibers 124, 126 to transfer into, and transfer from, the optical grating couplers 102, 104. Therefore, signals can be supplied to, and read from, the optical grating couplers 102, 104 without having to dice or cut the wafer 114, which saves time and expense associated with wafer cutting/dicing and potentially allows testing before the wafer 114 is completely finished, allowing partially manufactured defective wafers to be disposed of before unnecessary additional processing steps are performed. In this way, using perpendicular connections to the grating couplers 102, 104 with optical coupler structures 100 herein saves time and expense compared to edge-connected optical coupler structures, which can only be used after the wafer is divided into chips.

Figure 2A:
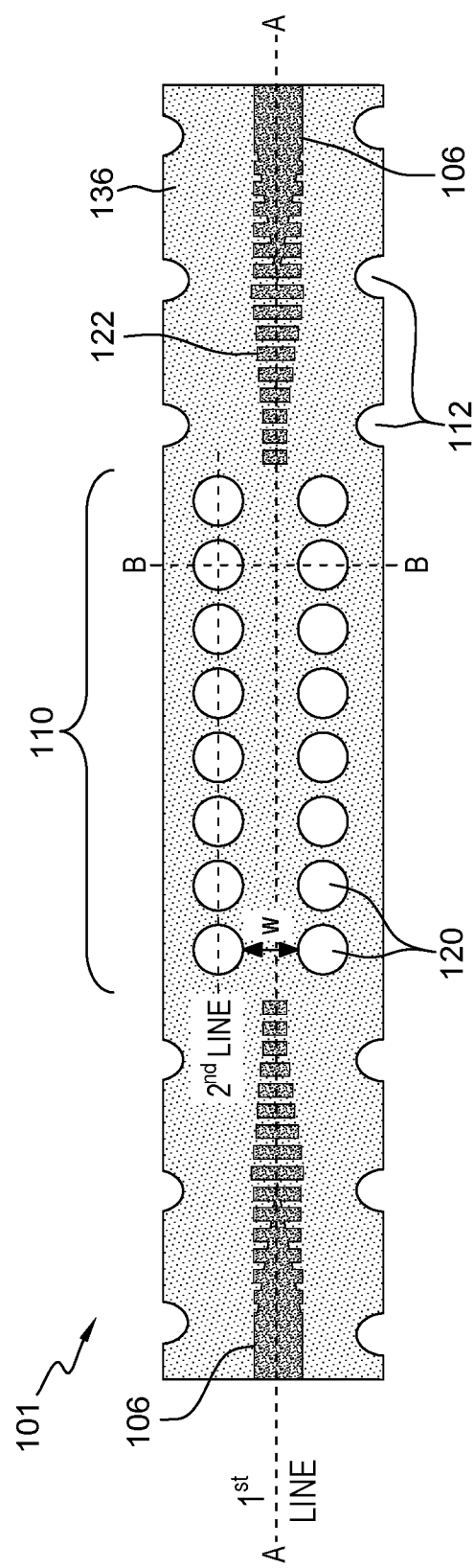
FIG. 2A is a top view schematic diagram illustrating a portion of the optical fiber coupler structure shown in FIG. 1A.
Figure 2B:
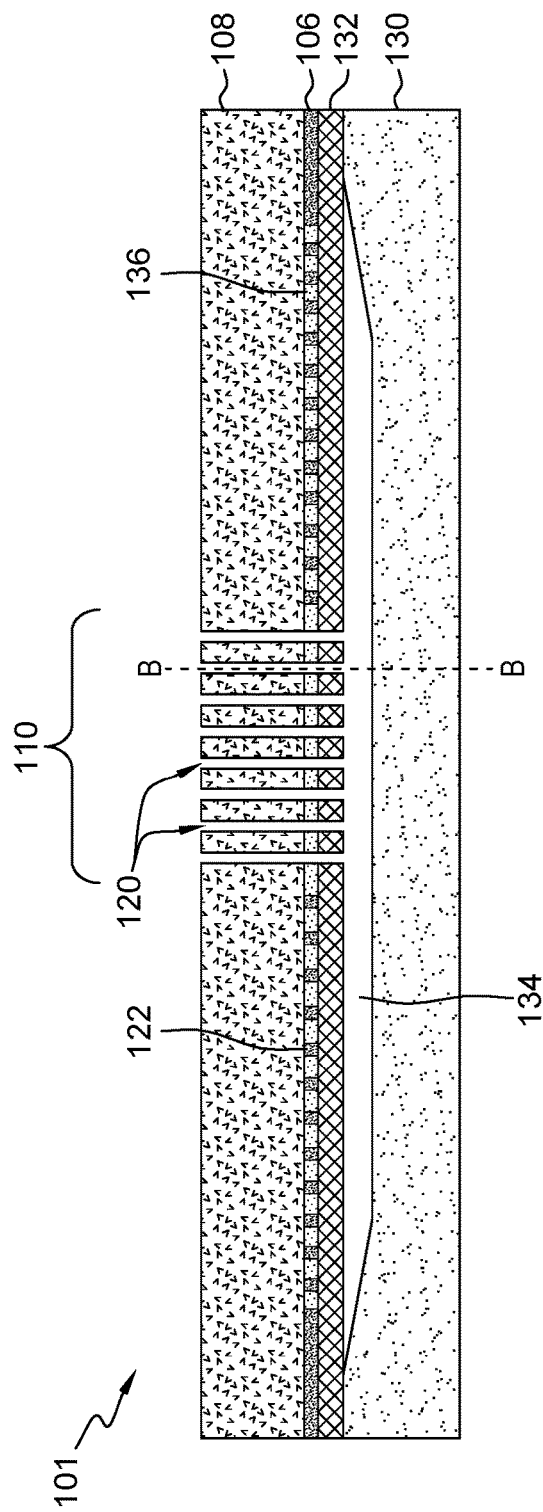
FIGS. 2B-2C are cross-sectional view schematic diagrams of the optical fiber coupler structure shown in FIG. 2A.
Figure 2C:
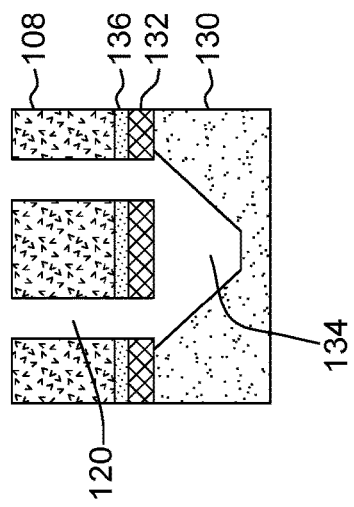

FIG. 2A is a top-view schematic diagram, which illustrates the rectangular area 101 in FIG. 1A that includes the transmission blocking region 110 between ends of the waveguide structure 106. FIG. 2B is a combined cross-sectional view of FIG. 2A along a portion of the $1^{st}$ line (A-A) and the $2^{nd}$ line (which is more distinctly shown as line C-C in FIGS. 4A, 5A, 6A, and 8A). FIG. 2C is a cross-sectional view of FIGS. 2A and 2B along line B-B. Note that the $1^{st}$ line and $2^{nd}$ are not shown in every top view drawing, but such lines are conceptually in the same location in every top view drawing accompanying this description.

FIGS. 2B and 2C illustrate that this coupler structure 100 includes an insulator layer 136 on a two-layer substrate 130, 132 (e.g., buried oxide (BOX) substrate) and that the waveguide structure 106 is in this insulator layer 136. Also, a cladding layer 108 is on the waveguide structure 106 and the insulator layer 136. In some embodiments herein, the cladding layer 108 and the insulator layer 136 can be the same layer and the same materials, while in other embodiments the two may be different and distinct from one another. The substrate 130 has a lower layer 130 connected to an upper layer 132 (both arbitrarily named), where the upper layer 132 is between the lower layer 130 and the insulator layer 136. The lower layer 130 includes a groove 134 aligned with and parallel to the waveguide structure 106. Note that the optical grating couplers 102, 104 can be on the substrate 130, the cladding layer 108, or other layers of the substrate 130 in a manner that the optical grating couplers 102, 104 form part of the upper (outer, top, etc.) surface of the wafer during and/or after manufacturing to allow the optical fibers 124, 126 to be directly physically connected to the optical grating couplers 102, 104, without wafer dicing or other disassembly.

The waveguide structure 106 is discontinuous between the optical grating couplers 102, 104. Thus, the waveguide structure 106 has discontinuous sections (e.g., breaks, gaps, missing portions, etc.) between the optical grating couplers 102, 104. As shown in FIGS. 2A-2B, the end portions 122 of the waveguide structure 106 are tapered and segmented to form metamaterial portions of the waveguide structure 106 (and these tapered "segments" or "metamaterial portions" are identified using identification number 122 in the drawings).

The segments 122 at the ends of such discontinuous sections of the waveguide structures 106 are tapered, meaning that they have a progressively reducing (or progressively increasing) size/width (e.g., size/width as measured in a direction perpendicular to the $1^{st}$ line) that alters the refractive index of the waveguide 106 relative to the cladding layer 108 and/or insulator layer 136 (promoting or discouraging light from exiting or entering the waveguide). This tapering and segmenting of the metamaterial portions (122) causes light energy to escape from one of the ends of the waveguide structures 106 and causes light energy to be absorbed (enter) into the opposing end of the waveguide structures 106.

Therefore, some light energy (as limited by the light-transmission restriction of the insulator layer 136) is transferred from one end of the waveguide structures 106 across the insulator layer 136 to the opposing end of the waveguide structures 106 and some light energy is lost within the insulator layer 136. This light energy that is transferred across the insulator layer 136 is output from one of the grating couplers 102, 104 and can be measured by an optical sensor within the test circuitry 128 (FIG. 1B). Differences in the output from different optical coupler structures 100 manufactured on different wafers 114 (given the same input) are results of manufacturing variations that the different wafers 114 experienced during manufacturing.

Thus, the cladding layer 108 and the insulator layer 136 includes what is referred to herein as a transmission blocking region 110 or optical mode rectifier that is between the discontinuous sections of the waveguide structure 106 (see FIG. 2A). The insulator layer 136 includes what is referred to herein as an "array" at the transmission blocking region 110. This array in the transmission blocking region 110 has structures that are highly sensitive to alignment issues caused by critical dimension offset defects and irregular sizing/spacing resulting from over-etching. Therefore, alignment issues experienced by all structures formed concurrently on the wafer 114 will change the amount, polarity, intensity, etc., of the light energy that travels from one end of the waveguide structures 106 across the insulator layer 136 to the opposing end of the waveguide structures 106. In different embodiments, this array can be a "void opening array" of openings 120 (shown in FIG. 2A for example, discussed below) or can be a "blocking element array" of disconnected elements 170 in the insulator layer 136 (shown in FIG. 8A for example, discussed below).

In the void opening array structures shown in FIGS. 2A-2C, the openings 120 of the void opening array extend fully from the top of the cladding layer 108 through the cladding layer 108, the insulator layer 136, and the upper layer 132 of the substrate 130 to the groove 134 in the lower layer 130 of the substrate 130, 132. The waveguide structure 106 is linear along the $1^{st}$ line shown in FIG. 2A, and the openings 120 of the void opening array are aligned in the insulator layer 136 parallel to and offset from the 1$^{st}$ line, only along the transmission blocking region 110. The openings 120 are contrasted with the periodic undercut holes 112 that are outside the transmission blocking region 110. Also, the periodic undercut holes 112 are aligned along a line that is parallel to, but offset from, a 2$^{nd}$ line formed by the openings 120 (and parallel to the 1$^{st}$ line); and, therefore, the periodic undercut holes 112 are not aligned with the openings 120 and the openings 120 are closer to the 1$^{st}$ line relative to the periodic undercut holes 112.

The position and size of the openings 120 change (e.g., increase/decrease) the light transfer characteristics the transmission blocking region 110. Improper alignment of the openings 120 during manufacturer of the optical coupler structures 100 and corresponding optical couplers within the chips 116 (caused by, for example, mask misalignment or improper etching) will cause one of the rows of openings 120 to move closer to the 1$^{st}$ line and this will change the light transfer characteristics the insulator layer 136 within the transmission blocking region 110. Changes in the light transfer characteristics of the transmission blocking region 110 caused by one of the rows of the openings 120 being closer to the 1$^{st}$ line (or caused by the openings 120 being larger or smaller than designed) in turn will change the amount of light energy transferred across the transmission blocking region 110 from one end of the waveguide structures 106 to the other, resulting in a change of the output signal provided at an output one of the grating couplers 102, 104 (relative to the designed/expected output signal). Therefore, alignment/sizing variations from mask misalignment/over-etching occurring within the optical couplers within the chips 116 are indicated by changes in the output signal provided at one of the grating couplers 102, 104.

In order to give meaning to alignment/sizing changes of the openings 120, the openings 120 are formed using the same masks that are used to form alignment-sensitive features of the optical couplers within the chips 116. For example, the mask used to pattern some or all of the opening 120 in the optical coupler structure 100 can be the same mask used to pattern the V-groove that self-aligns the optical fiber within the optical coupler devices of the chips 116 or the same mask used to pattern the waveguide within the optical coupler devices of the chips 116, etc. Over-etching/misalignment of the V-groove or waveguide within the optical coupler devices of the chips 116 will result in alignment/sizing changes of the openings 120 because the same mask and etching processes are concurrently/simultaneously used to create both these items.

Thus, in one non-limiting example, if the same mask is used to pattern the openings 120 and the V-groove within the optical coupler devices of the chips 116, misalignment or over-etching would cause the openings 120 and the V-groove to be misaligned or differently sized from their design size (e.g., too large, too small). Misalignment or differently sized openings 120 produce changes in the light conducting characteristics of the transmission blocking region 110 resulting in the output signal provided at one of the grating couplers 102, 104, which provides an indication that the optical fiber will not properly align in the V-groove at the edges of the optical coupler devices of the chips 116. Again, this misalignment indication is produced without utilizing edge-connected optical coupler structures because the optical coupler structure 100 herein utilizes grating couplers 102, 104.

While a few masks are mentioned above (e.g., V-groove patterning mask, waveguide patterning mask, etc.), any mask or other processing step utilize to manufacture any component of the optical coupler devices of the chips 116 can be used to pattern the openings 120. Therefore, many different alignment-sensitive features of the optical coupler devices of the chips 116 could be identified and the formation of the openings 120 can be made concurrently/simultaneously with such features (using the same manufacturing processes and structures) to allow variations of the openings 120 to provide an indication of manufacturing variances of the optical coupler devices of the chips 116.

Additionally, different ones of the openings 120 can be formed at different processing stages of the optical coupler formation. Therefore, for example, if three masks/etching processes are determined to be critical to proper alignment of components within the optical couplers within the chips 116, at least one of the openings 120 in each of the rows of openings 120 can be formed using a first of the three masks, at least another one of the openings 120 in each of the rows of openings 120 can be formed using a second one of the three masks, and yet an additional one or more of the openings 120 in each of the rows of openings 120 can be formed using a last one of the three masks. Misalignment of any of these three masks will result in at least some of the openings 120 being closer to the 1$^{st}$ line, thereby changing the output signal provided at one of the grating couplers 102, 104. In this way, some of the openings 120 can represent formation of one component of the optical couplers within the chips 116, while other openings 120 can represent formation of a different component of the optical couplers within the chips 116. Therefore, the openings 120 are not limited to monitoring a single component of the optical couplers within the chips 116 but instead can be used to simultaneously monitor manufacture of multiple components of the optical couplers within the chips 116 that are formed at different manufacturing processing stages.

Using different openings 120 to represent different manufacturing processing stages of the optical couplers within the chips 116 can also be used to indicate the severity of the misalignment because misalignment of a relatively greater number of openings 120 will generally produce a relatively a larger divergence of the output signal (relative to the design output signal that assumes no manufacturing defects). For example, if only one of these three masks is misaligned, the change in the output signal maybe slight; however, if all three masks are misaligned, the change in the output signal will be larger, indicating a greater misalignment problem. In this way, when different openings 120 are used to represent different manufacturing processing stages of the optical couplers within the chips 116, a larger divergence of the output signal can indicate more severe misalignment issues.

In a conceptually related feature of the structures herein, the relative importance of alignment of different components of the optical couplers within the chips 116 having different alignment criticalities can be taken into account during testing. For example, when using different openings 120 to represent different manufacturing processing stages of the optical couplers within the chips 116, relatively more openings 120 can be correlated to a first component of the optical couplers within the chips. This first component may be considered to have a relatively higher alignment criticality because the proper functionality of this first component within the optical couplers within the chips 116 may be highly correlated to proper alignment. In contrast, less openings 120 may be correlated to a second component of the optical couplers within the chips 116 whose proper functioning may not be as sensitive to proper alignment. With this, misalignment of the first feature (and corresponding misalignment of a relatively greater number of the openings 120 in the transmission blocking region 110) will cause a greater change in the output signal relative to misalignment of the second feature (which will result in misalignment relatively smaller number of the openings 120). In this way, when different openings 120 are used to represent different manufacturing processing stages of the optical couplers within the chips 116, a larger divergence of the output signal can indicate that a more alignment-critical component has suffered from a manufacturing defect.

Therefore, all of the openings 120 do not need to be formed in the same process (but they can be) and, in some implementations of structures herein, different openings 120 can be formed simultaneously with different processing stages of the optical couplers within the chips 116. Alternatively, the CD offset and misalignment of the segmented structure 106 can also impact the light transmission and thus its fabrication quality can be revealed, even if the opening 120 is well fabricated.

FIGS. 3A-3D demonstrate that different patterns of openings 120 can be utilized for different test purposes. For example, as shown in FIGS. 3A-3C, different widths (w1 vs. w2 vs. w3) between the openings can be utilized to control the amount of misalignment that will cause variation in the output signals. Because the openings 120 are space further apart in FIG. 3C relative to FIGS. 3A and 3B, the opening pattern in FIG. 3A will most readily produce variation in the outputs signals for a smaller amount of misalignment, while the pattern shown in FIG. 3B will produce relatively less output signal variation, and the pattern shown in FIG. 3C even less output signal variation. In this way spacing between the rows of openings 120 can control the sensitivity of the optical coupler structures herein.

While the previous examples show that the openings 120 of the void opening array can be aligned linearly, FIG. 3D illustrates that the openings can be aligned curvilinearly to focus the testing on other manufacturing aspects of the optical couplers within the chips 116, which is especially useful when using different openings 120 to represent different manufacturing processing stages of the optical couplers within the chips 116, as discussed above. For example, the openings 120 closer to the $1^{st}$ line will have more impact (greater significance) on the changes to the output signal because they will alter the light transmission characteristics of the transmission blocking region 110 to a greater extent compared to those openings 120 that are further from the $1^{st}$ line.

Therefore, with the arrays at the transmission blocking region 110 shown in FIGS. 2A-3D, differences in output from different optical coupler structures 100 manufactured on different wafers 114 can be used to very accurately predict the edge alignment characteristics of the concurrently formed fiber-optic couplers on those different wafers. Further, these edge alignment characteristic differences of the concurrently formed fiber-optic couplers within the chips 116 can be found using inputs and outputs supplied to and received from the grating couplers 102, 104, which avoids the need to supply signals in an edge-connected manner. In other words, alignment characteristics differences of the fiber-optic couplers concurrently formed with the optical coupler structures 100 can be found without dicing the wafer or aligning optical fibers with edges of edge-connected optical coupler structures because the signals and output can be determined using optical fibers perpendicularly connected to the grating couplers 102, 104 on the uncut wafer with the optical coupler structures 100 herein.

Figure 4A:
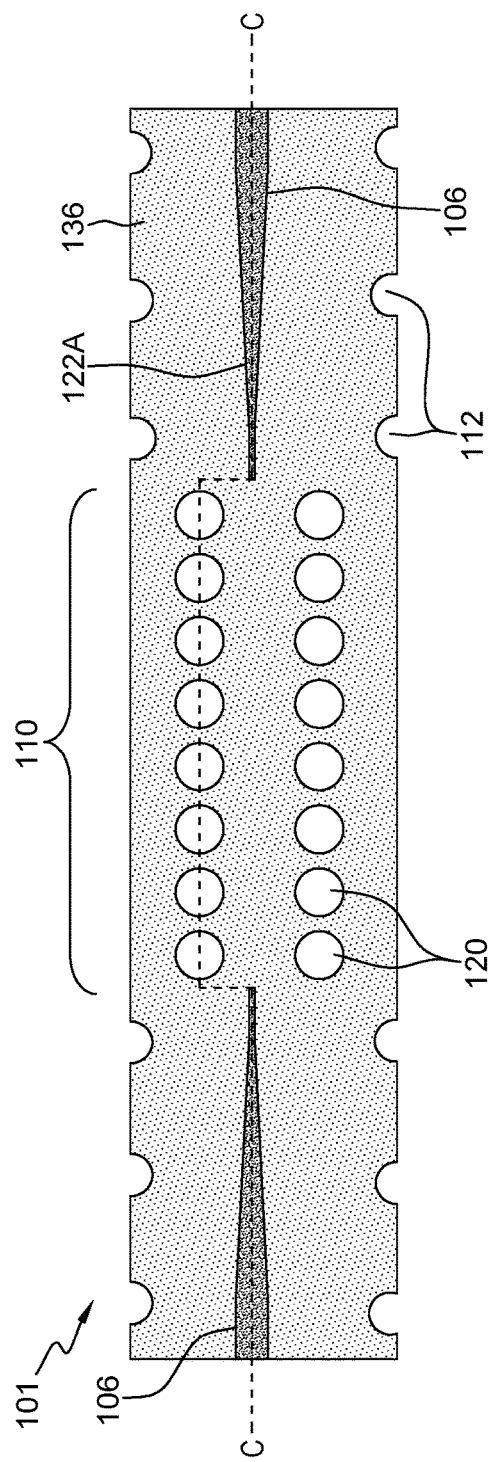
FIG. 4A is a top view schematic diagram illustrating a portion of the optical fiber coupler structure shown in FIG. 1A.
Figure 4B:
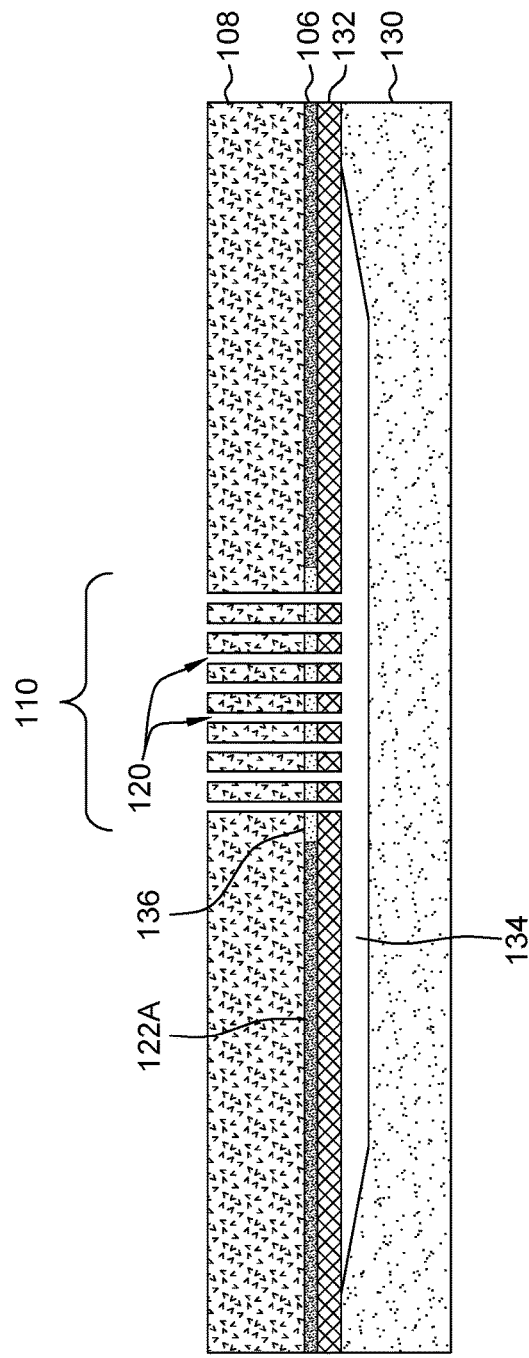
FIG. 4B is cross-sectional view schematic diagrams of the optical fiber coupler structure shown in FIG. 4A.

FIGS. 4A-4B avoid using the segments or metamaterials 122 that are shown in the previous embodiments. FIG. 4B is cross-sectional view schematic diagrams of the optical fiber coupler structure shown in FIG. 4A a long line C-C (which is formed from portions of the $1^{st}$ line and the $2^{nd}$ line shown in FIG. 2A). The continuous waveguide 106 shown in FIGS. 4A-4B uses continuous tapered sections 122A that can change the light energy that is transferred across the transmission blocking region 110 (relative to the segments or metamaterials 122) allowing further refinement of the optical coupler structures 100 herein for different forms of testing.

Figure 6A:
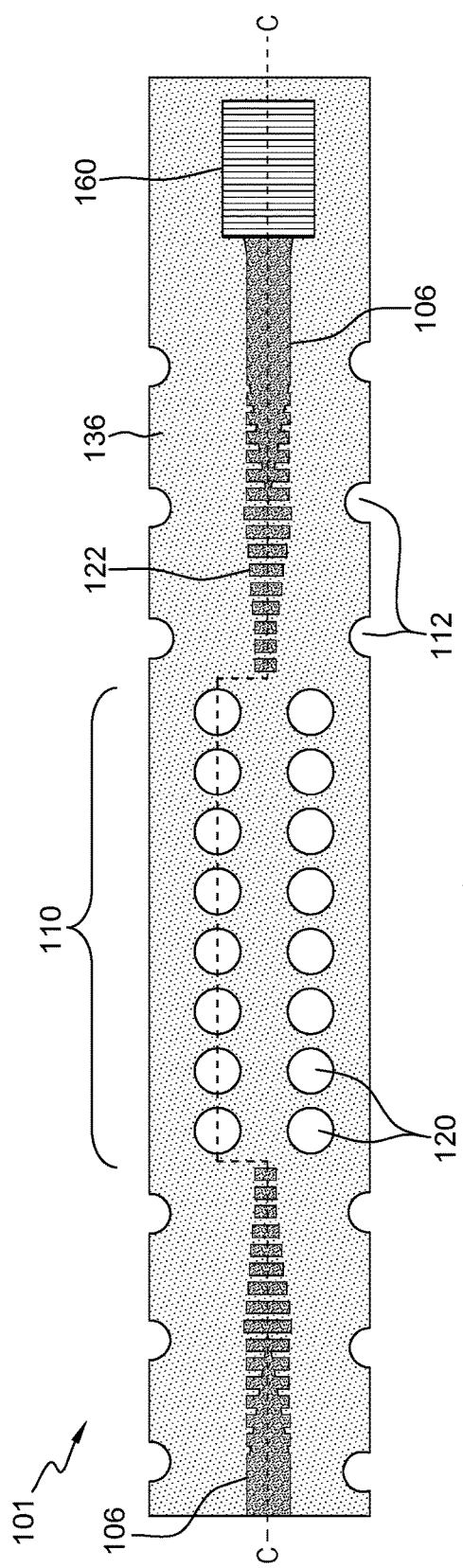
FIG. 6A is a top view schematic diagram illustrating a portion of the optical fiber coupler structure according to embodiments herein.
Figure 6B:
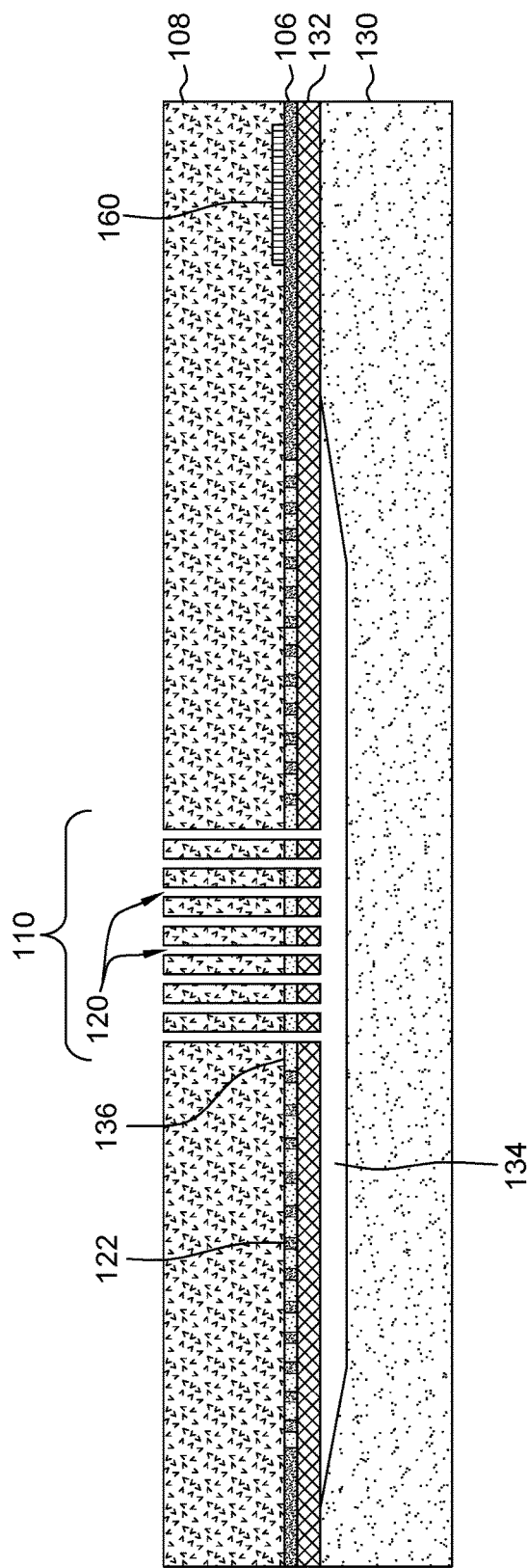
FIG. 6B is a cross-sectional view schematic diagram of the optical fiber coupler structure shown in FIG. 6A.

FIGS. 5A-5B and 6A-6B include an additional grating coupler 150 and a photodetector 160, respectively, which can be utilized to provide different connections for the optical coupler structures 100. Specifically, item 150 is a grating coupler directly connect within the structure to directly light export and item 160 is photodetector built adjacent to the structure to measure transmitted power without light export. FIG. 5B is cross-sectional view schematic diagrams of the optical fiber coupler structure shown in FIG. 5A a long line C-C and similarly FIG. 6B is cross-sectional view schematic diagrams of the optical fiber coupler structure shown in FIG. 6A a long line C-C. In these different examples, the grating coupler or photodetector 150, 160 have different shapes and can be formed of different materials. For example, the surface grating 150 can be formed by the combination of a bottom silicon slab and top periodic curved grating. The photodetector 160 can be formed as a deposited germanium photodetector having a rectangular shape with evanescent light coupling. These grating coupler and photodetector 150, 160 can be formed simultaneously within the optical couplers within the chips 116. The grating coupler 150, can therefore comprise any useful crystalline-silicon comparable material including polycrystalline silicon (polysilicon), amorphous silicon, a combination of amorphous silicon and polysilicon, and, rendered conductive by the presence of a suitable dopant. Alternatively, the photodetector 160 herein may be comprise metal such as germanium for near-IR signal absorption and detection, or silicon for shorter wavelength signal absorption and detection, any alloys of such metals, and may be deposited using physical vapor deposition, chemical vapor deposition, or any other technique known in the art. The materials selected for these grating coupler or photodetector were 150, 160 and any other component discussed herein is made to promote most effective operation of the optical couplers within the chips 116 and/or the optical coupler structures 100.

Figure 7:
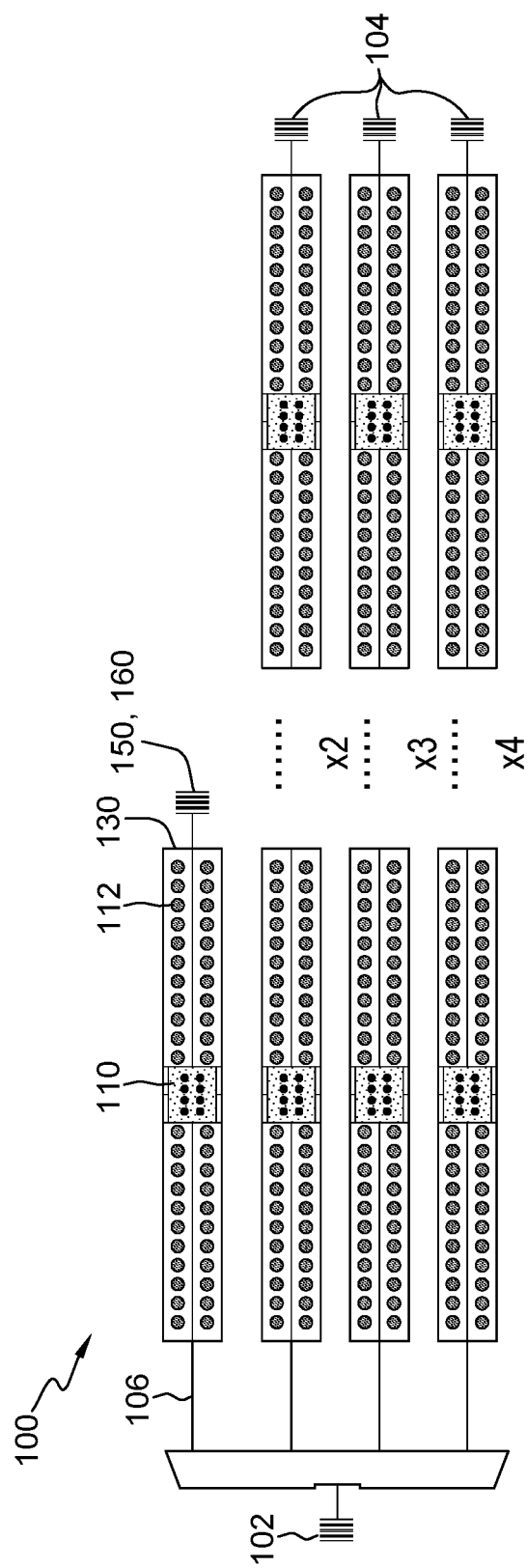
FIG. 7 is a top view schematic diagram illustrating an optical fiber coupler structure shown in FIGS. 5A-6B.

FIG. 7 illustrates one way in which the grating coupler 150 of FIGS. 5A-5B or the photodetector 160 of FIGS. 6A-6B could be utilized. Specifically, FIG. 7 illustrates many of the optical coupler structures 100 connected to a grating coupler 102 that supplies multiple waveguides 106. The grating coupler or photodetector 150, 160 can connect to other optical coupler structures 100 (twice as many (×2), three times as many (×3), four times as many (×4)), which eventually connect to another grating coupler 104 to build up the cut-back measurement. Each of the different optical coupler structures 100 can be designed to evaluate the same or a different manufacturing aspect of the optical couplers within the chips 116, or different optical coupler structures 100 can be dedicated to specific chips 116 on the wafer 114. Therefore, the structure shown in FIG. 7 permit simultaneous testing of many different optical couplers and many different manufacturing aspects of the optical couplers.

Figure 8A:
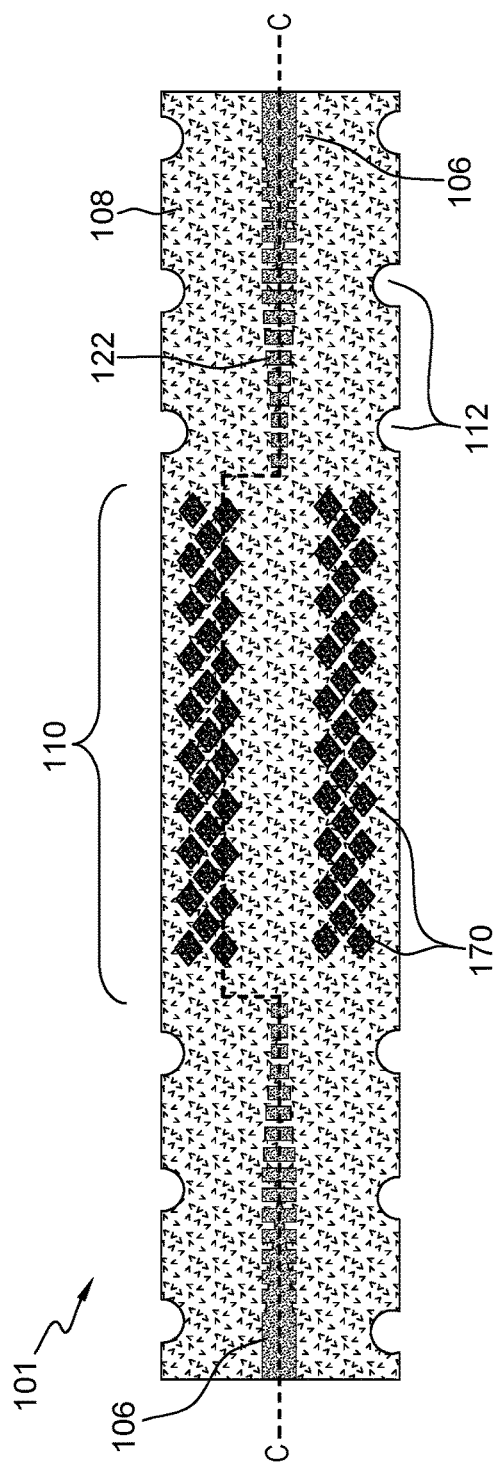
FIG. 8A is a top view schematic diagram illustrating a portion of the optical fiber coupler structure shown in FIG. 1A.
Figure 8B:
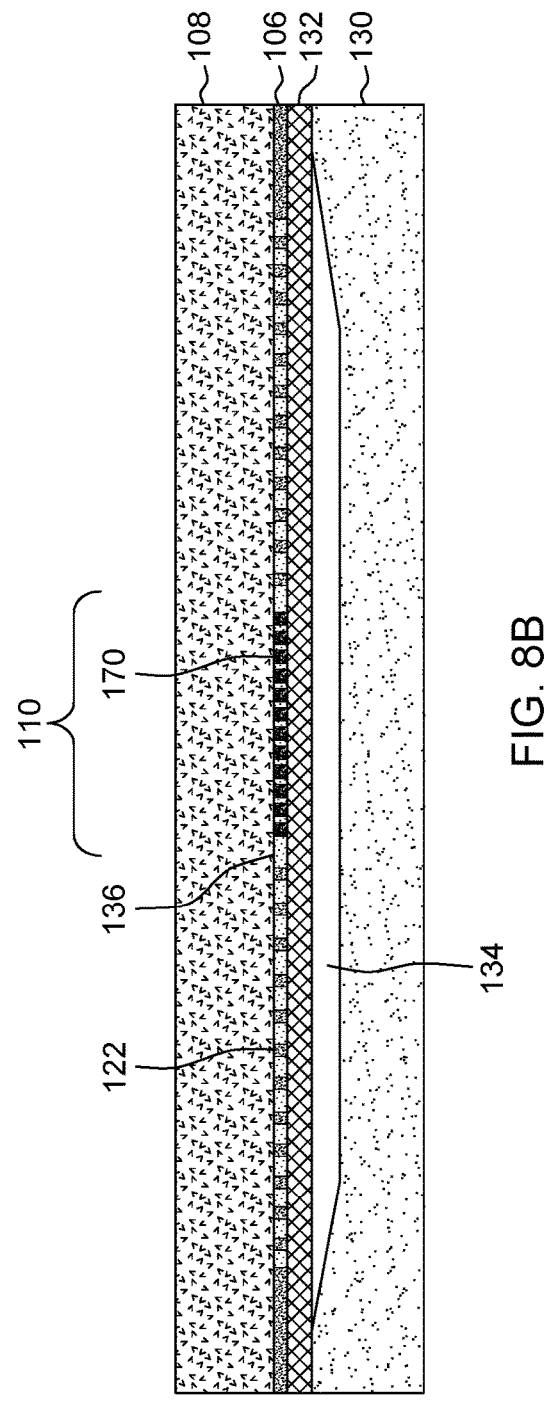
FIGS. 8B-8C are cross-sectional view schematic diagrams of the optical fiber coupler structure shown in FIG. 8A.
Figure 8C:
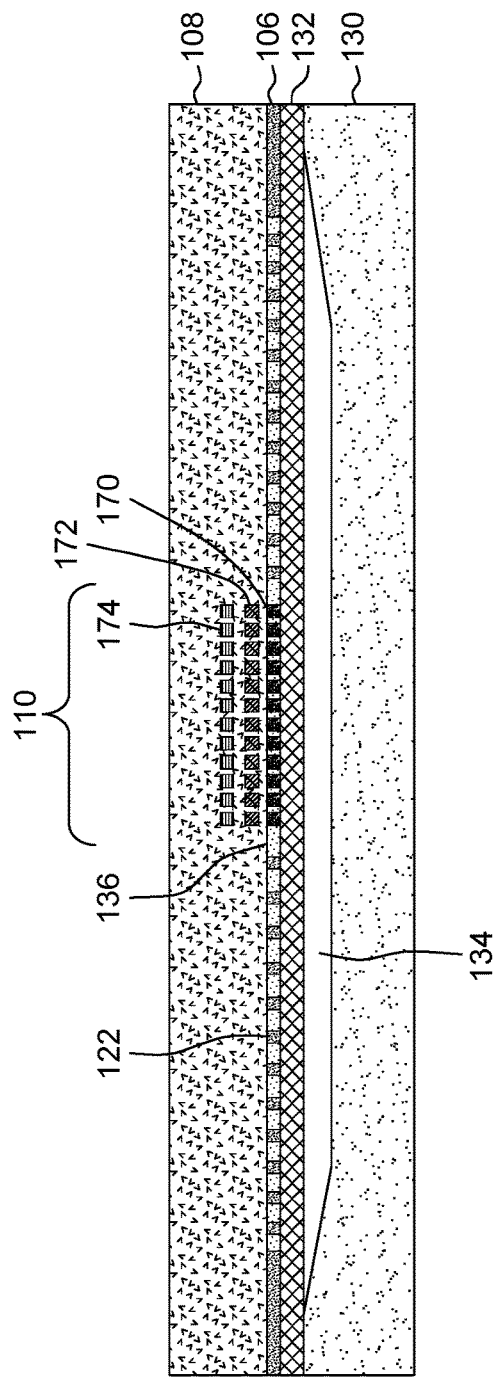
Figure 9:
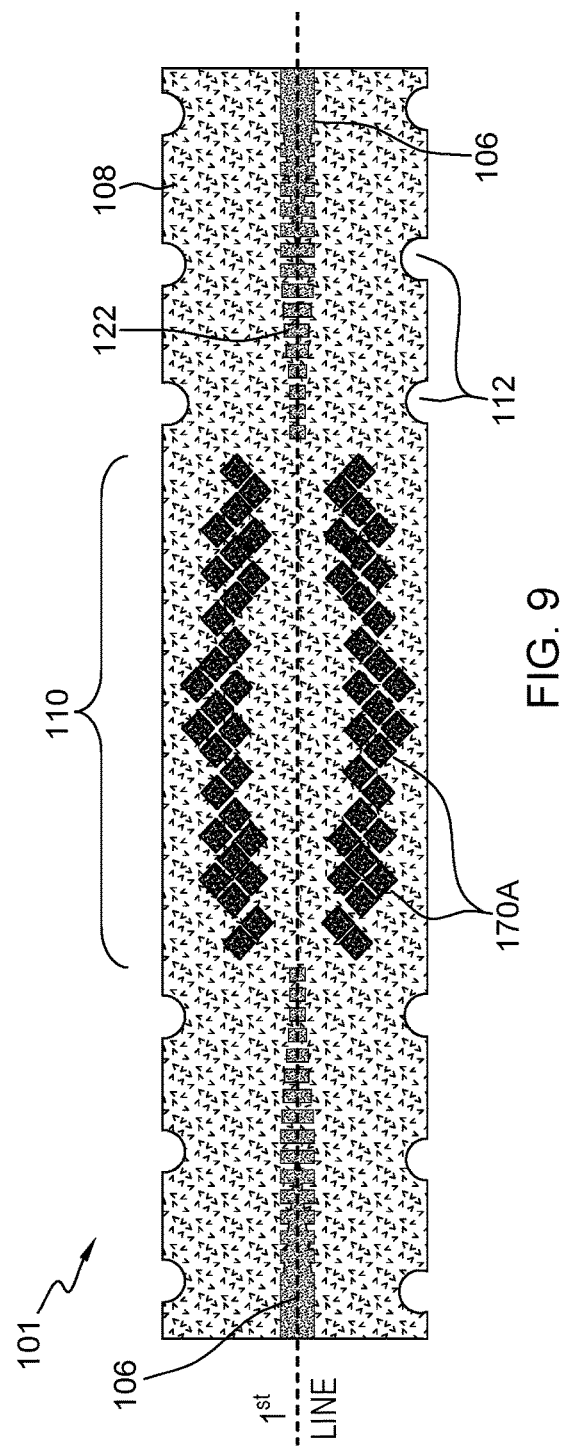
FIG. 9 is a top view schematic diagram illustrating a portion of the optical fiber coupler structure shown in FIG. 1A.

Some other examples of the array structures within the transmission blocking region 110 are shown in FIGS. 8A-9. In these examples, the previously discussed patterns of openings 120 are not utilized and instead disconnected elements 170, 172, 174 are utilized to change the light transmission characteristics of the transmission blocking region 110. Again, both the openings 120 and the disconnected elements 170, 172, 174 change the light characteristic of the transmission blocking region 110 relative to what would otherwise be a continuous, unbroken, featureless portion of the insulator layer 136. The disconnected elements 170, 172, 174 discussed below can be positioned in the same locations and have the same patterns as the openings 120 discussed above. They function similarly to the void holes 120 to block or scatter part of the light that passes through the transmission blocking region 110. In contrast, the periodic undercut holes 112 are used to generate the undercut for the V-groove and are not used as any form of functional blocker as the void holes 120 or the disconnected elements 170, 172, 174 are.

Specifically, FIGS. 8B and 8C are cross-sectional view schematic diagrams of the optical fiber coupler structure shown in FIG. 8A along line C-C. In a similar manner to that discussed above, the disconnected elements 170 are only in the transmission blocking region 110, and the disconnected elements 170 are offset from the $1^{st}$ line. The disconnected elements 170 of the blocking element array are aligned in the insulator layer 136 parallel to and offset from the $1^{st}$ line along the transmission blocking region 110. In a similar manner to misalignment of the openings 120 discussed above, misalignment, size change, or offset defects during manufacturing can result in corresponding misalignment, size change, offset, etc., of the disconnected elements 170, which will change the transmission characteristics of the transmission blocking region 110. For example, as noted above, one or more of the disconnected elements 170 can move in between the ends of the waveguide 106 as a result alignment of offset manufacturing defects and this can change the output signal to thereby indicate that these manufacturing defects have occurred within the optical couplers in the chips 116.

The disconnected elements 170 are formed concurrently/simultaneously in the same manufacturing processing steps used to form components of the optical couplers and the chips 116. Therefore, the disconnected elements 170 can be one of many different materials. For example, the disconnected elements 170 can comprise the same material as the waveguides 106 (e.g., silicon) or a different material (e.g., poly silicon, silicon nitride, etc.), etc. Additionally, each different material utilized for the disconnected elements 170 can have a different effect upon the light transmitting characteristics of the transmission blocking region 110 when there is misalignment/offset manufacturing defects, which can result in different changes of the output signal.

In a similar manner to the openings 120 discussed above, different ones of the disconnected elements 170 can be used to represent different manufacturing processing stages of the optical couplers within the chips 116. As noted above, a larger divergence of the output signal can indicate more severe misalignment issues or that higher alignment-critical components of the optical couplers within the chips 116 may be affected. The disconnected elements 170 therefore can be used in an identical manner as the openings 120 are discussed above. However, while the openings 120 are useful for testing masking and edging processes, the disconnected elements 170 are instead useful for deposition, implantation, and other material formation processes. Therefore, the disconnected elements 170 are as equally useful when testing for critical dimension offset defects and irregular sizing/spacing resulting from defects in material formation processes.

The disconnected elements 170 of the blocking element array can be at one or more levels within the insulator layer 136 and the cladding layer 108. FIG. 8C illustrates that multiple levels of the disconnected elements (170, 172, 174) may be formed at different manufacturing processing stages of the optical couplers within the chips 116. The different patterns and different materials used for the different levels of the disconnected elements 170, 172, 174 can be selected/adjusted to reflect alignment criticality of different components within the optical couplers within the chips 116, in the same manner as discussed above. For example, misalignment of one of the different levels of the disconnected elements 170, 172, 174, can produce an output with a different signature relative to misalignment of a different level because of different patterns and/or different materials used for the different levels of the disconnected elements 170, 172, 174. Again, here the output does not just indicate that some manufacturing variation is present, but instead the output can indicate the specific component or processing step associated with the manufacturing variation.

Thus, with regard to alignment-sensitive or offset-sensitive processing stages of the optical coupler formation, the disconnected elements 170, 172, 174 are formed concurrently with such processing that forms the optical couplers within the chips 116. Therefore, improper alignment/offset of some or more of the disconnected elements 170, 172, 174 can indicate a manufacturing variation specific alignment or offset problem of the optical couplers within the chips 116. Also, severity of the misalignment or offset issue can be shown by the amount of change in the output signal caused when one or more of the disconnected elements 170, 172, 174 changes the light transmitting characteristics of the transmission blocking region 110.

As was noted with FIG. 3D above, in FIG. 9 illustrates that the disconnected elements 170 can be aligned curvilinearly to focus the testing on other manufacturing aspects of the optical couplers within the chips 116 or to allow some of the disconnected elements 170 (that are closer to the $1^{st}$ line) to have more impact (greater significance) on the changes to the output signal.

As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method described above. In other words, one or more computer hardware devices can be created that are configured to implement the method and processes described herein with reference to the figures and their corresponding descriptions.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. An optical coupler structure comprising:
   an insulator layer on a substrate;
   a waveguide structure in the insulator layer;
   a cladding layer on the waveguide structure and the insulator layer; and
   optical grating couplers on the cladding layer,
   wherein the waveguide structure is connected between the optical grating couplers,
   wherein the waveguide structure comprises discontinuous sections between the optical grating couplers, and
   wherein the insulator layer includes a void opening array at a transmission blocking region between the discontinuous sections of the waveguide structure.

2. The optical coupler structure according to claim 1, wherein the void opening array comprises openings extending through the cladding layer, the insulator layer, and an upper layer of the substrate.

3. The optical coupler structure according to claim 2, wherein the waveguide structure is linear along a first line, and wherein the openings of the void opening array are aligned in the insulator layer parallel to and offset from the first line along the transmission blocking region.

4. The optical coupler structure according to claim 2, wherein the openings of the void opening array are aligned linearly or curvilinearly.

5. The optical coupler structure according to claim 2, wherein the substrate comprises a lower layer connected to the upper layer,
   wherein the upper layer is between the lower layer and the insulator layer, wherein the lower layer includes a groove aligned with and parallel to the waveguide structure, wherein the openings of the void opening array extend from the cladding layer to the groove.

6. The optical coupler structure according to claim 1, further comprising a patterned conductor on at least one of the discontinuous sections of the waveguide structure.

7. The optical coupler structure according to claim 1, wherein the waveguide structure comprises continuous or segmented tapered waveguide structure ends that border the transmission blocking region.

8. An optical coupler structure comprising:

an insulator layer on a substrate;

a waveguide structure in the insulator layer;

a cladding layer on the waveguide structure and the insulator layer; and optical grating couplers on the cladding layer, wherein the waveguide structure is connected between the optical grating couplers, wherein the waveguide structure comprises discontinuous sections between the optical grating couplers, and wherein the insulator layer includes a blocking element array at a transmission blocking region between the discontinuous sections of the waveguide structure.

9. The optical coupler structure according to claim 8, wherein the blocking element array comprises disconnected elements in the insulator layer.

10. The optical coupler structure according to claim 9, wherein the waveguide structure is linear along a first line, and wherein the disconnected elements of the blocking element array are aligned in the insulator layer parallel to and offset from the first line along the transmission blocking region.

11. The optical coupler structure according to claim 9, wherein the disconnected elements of the blocking element array are aligned linearly or curvilinearly.

12. The optical coupler structure according to claim 9, wherein the disconnected elements of the blocking element array comprise one or more levels of a conductive disconnected elements or insulating disconnected elements within the insulator layer and the cladding layer.

13. The optical coupler structure according to claim 8, further comprising a patterned conductor on at least one of the discontinuous sections of the waveguide structure.

14. The optical coupler structure according to claim 8, wherein the waveguide structure comprises continuous or segmented tapered waveguide structure ends that border the transmission blocking region.

15. An optical coupler structure comprising:

an insulator layer on a substrate;

a waveguide structure in the insulator layer;

a cladding layer on the waveguide structure and the insulator layer; and optical grating couplers on the cladding layer, wherein the waveguide structure is connected between the optical grating couplers, wherein the waveguide structure comprises discontinuous sections between the optical grating couplers, and wherein the insulator layer includes an array at a transmission blocking region between the discontinuous sections of the waveguide structure.

16. The optical coupler structure according to claim 15, wherein the array comprises a blocking element array of disconnected elements in the insulator layer.

17. The optical coupler structure according to claim 16, wherein the waveguide structure is linear along a first line, and wherein the disconnected elements of the blocking element array are aligned in the insulator layer parallel to and offset from the first line along the transmission blocking region.

18. The optical coupler structure according to claim 16, wherein the disconnected elements of the blocking element array comprise one or more levels of a conductive disconnected elements or insulating disconnected elements within the insulator layer and the cladding layer.

19. The optical coupler structure according to claim 15, wherein the array comprises a void opening array of openings extending through the cladding layer, the insulator layer, and an upper layer of the substrate, and wherein the openings of the void opening array are aligned linearly or curvilinearly.

20. The optical coupler structure according to claim 15, further comprising a patterned conductor on at least one of the discontinuous sections of the waveguide structure.

* * * * *